United States Patent
Liu et al.

(12) 
(10) Patent No.: US 8,057,849 B2
(45) Date of Patent: Nov. 15, 2011

(54) ULTRA LOW MELT METAL NANOPARTICLE COMPOSITION FOR THICK-FILM APPLICATIONS

(75) Inventors: Ping Liu, Mississauga (CA); Yiliang Wu, Oakville (CA); Anthony J. Wigglesworth, Oakville (CA); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 17 days.

(21) Appl. No.: 12/631,153

(22) Filed: Dec. 4, 2009

(65) Prior Publication Data

US 2011/0135808 A1    Jun. 9, 2011

(51) Int. Cl.
*B05D 5/12* (2006.01)
(52) U.S. Cl. ......................................... 427/71
(58) Field of Classification Search ........ 427/FOR. 105, 427/191, 71, 205, 125
See application file for complete search history.

(56) References Cited

U.S. PATENT DOCUMENTS

| | | | |
|---|---|---|---|
| 7,270,694 B2 | 9/2007 | Li et al. | |
| 7,494,608 B2 | 2/2009 | Li et al. | |
| 2007/0088117 A1* | 4/2007 | Zhou et al. | 524/539 |
| 2007/0099357 A1 | 5/2007 | Li et al. | |
| 2009/0148600 A1* | 6/2009 | Li et al. | 427/256 |
| 2009/0181183 A1 | 7/2009 | Li et al. | |
| 2009/0274834 A1 | 11/2009 | Chopra et al. | |
| 2010/0283024 A1* | 11/2010 | Yoshizumi | 257/2 |

OTHER PUBLICATIONS

Mitsunori Itoh et al, Journal of Nanoscience and Nanotechnology, vol. 9, 6655-6660, 2009.*
Yiliang Wu et al (Journal of American Chemical Society, 2006, 128, 4202-4203.*
Yukiyasu Kashiwagi et al (Journal of Colloid and Interface Science, 2006, 300, 169-175.*
U.S. Appl. No. 12/133,548 to Chretien, filed Jun. 5, 2008 (Xerox Docket No. 2007-1792-US-NP).

* cited by examiner

*Primary Examiner* — Michael Cleveland
*Assistant Examiner* — Tabassom Tadayyon Eslami
(74) *Attorney, Agent, or Firm* — Oliff & Berridge, PLC

(57) ABSTRACT

A method of forming conductive features on a substrate, the method includes reacting a metal compound with a reducing agent in the presence of a stabilizer in a reaction mixture comprising the metal compound, the reducing agent, and the stabilizer, wherein the reaction mixture is substantially free of solvent, to form a plurality of metal nanoparticles with molecules of the stabilizer on the surface of the metal nanoparticles. After isolating the plurality of metal nanoparticles, a liquid composition that includes a polymeric binder, a liquid and the plurality of metal nanoparticles with molecules of the stabilizer on the surface of the metal nanoparticles is deposited on a substrate by a liquid deposition technique to form a deposited composition. The deposited composition is then heated to form conductive features on the substrate.

19 Claims, No Drawings

ULTRA LOW MELT METAL NANOPARTICLE COMPOSITION FOR THICK-FILM APPLICATIONS

BACKGROUND

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, etc. However the deposition and/or patterning of functional electrodes, pixel pads, and conductive traces, lines and tracks which meet the conductivity, processing, and cost requirements for practical applications have been a great challenge. Silver is of particular interest as a conductive element for electronic devices because silver is much lower in cost than gold and silver possesses much better environmental stability than copper.

U.S. Pat. No. 7,270,694, which is hereby incorporated by reference herein in its entirety, discloses a process comprising reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles.

U.S. Pat. No. 7,494,608, which is hereby incorporated by reference herein in its entirety, discloses a composition comprising a liquid and a plurality of silver-containing nanoparticles with a stabilizer, wherein the silver-containing nanoparticles are a product of a reaction of a silver compound with a reducing agent comprising a hydrazine compound in the presence of a thermally removable stabilizer in a reaction mixture comprising the silver compound, the reducing agent, the stabilizer, and an organic solvent wherein the hydrazine compound is a hydrocarbyl hydrazine, a hydrocarbyl hydrazine salt, a hydrazide, a carbazate, a sulfonohydrazide, or a mixture thereof, and wherein the stabilizer includes an organoamine.

Silver nanoparticles have also been prepared, for example as described in U.S. Pub. No. 2007/0099357 A1, incorporated by reference herein in its entirety, using 1) amine-stabilized silver nanoparticles and 2) exchanging the amine stabilizer with a carboxylic acid stabilizer. However, this method typically requires a carboxylic acid with a carbon chain length greater than 12 carbon atoms to afford sufficient solubility for solution-processing. Due to the high boiling point of such long-chain carboxylic acids and the strong bond between the carboxylic acid and silver nanoparticles, the annealing temperature required for obtaining conductive silver films is typically greater than 200° C.

While currently available methods for preparing conductive elements for electronic devices are suitable for their intended purposes, there remains a need for an method suitable for preparing conductive structures with a thickness of several micrometers and a low annealing temperature, wherein the metal nanoparticles used to prepared the conductive structure possess an increased shelf life. Although some specialty plastic substrates can withstand annealing temperatures of 250° C., most plastic substrates cannot and thus, dimensional stability is still an issue. Moreover, low cost plastic substrates favor an annealing temperature below 150° C. Further, a need remains for lower cost, environmentally safe methods for preparing liquid processable, stable metal nanoparticle compositions that are suitable for fabricating electrically conductive elements of electronic devices and have an increased shelf life.

SUMMARY

There is therefore a need, addressed by the subject matter disclosed herein, for a method of forming conductive features having a thickness of several micrometers and annealing (post-processing) of the metal nanoparticles at temperatures below at least about 130° C.

The above and other issues are addressed by the present application, wherein in embodiments, the application relates to a method of forming conductive features on a substrate, the method comprising: reacting a metal compound with a reducing agent in the presence of a stabilizer in a reaction mixture comprising the metal compound, the reducing agent, and the stabilizer, wherein the reaction mixture is substantially free of solvent, to form a plurality of metal nanoparticles with molecules of the stabilizer on the surface of the metal nanoparticles; isolating the plurality of metal nanoparticles with the molecules of the stabilizer on the surface of the metal nanoparticles; preparing a liquid composition including a polymeric binder, a liquid and the plurality of metal nanoparticles with molecules of the stabilizer on the surface of the metal nanoparticles; depositing the liquid composition on a substrate by a liquid deposition technique to form a deposited composition; and heating the deposited composition to form conductive features on the substrate.

In embodiments, described is a composition comprising a polymeric binder, a liquid and a plurality of metal nanoparticles with a stabilizer attached on the surface of the metal nanoparticles, wherein the metal nanoparticles are the product of a reaction of a metal compound with a reducing agent in the presence of a stabilizer in a reaction mixture comprising the metal compound, the reducing agent, and the stabilizer, wherein said reaction mixture is substantially free of solvent.

In embodiments, described is a method of forming conductive features on a substrate, the method comprising: reacting a metal compound with a reducing agent in the presence of a stabilizer in a reaction mixture comprising the metal compound, the reducing agent, and the stabilizer, wherein the reaction mixture is substantially free of solvent, to form a plurality of metal nanoparticles during the solvent-free reduction process with molecules of the stabilizer on the surface of the metal nanoparticles; isolating the plurality of metal nanoparticles with the molecules of the stabilizer on the surface of the metal nanoparticles; preparing a liquid composition including a polymeric binder, a liquid and the plurality of metal nanoparticles with molecules of the stabilizer on the surface of the metal nanoparticles; depositing the liquid composition on a substrate by a liquid deposition technique to form a deposited composition; and heating the deposited composition to form conductive features on the substrate with a thickness of from about 1 micrometer to about 100 micrometers.

EMBODIMENTS

The present process is for preparing stabilized, in embodiments organoamine-stabilized, metal nanoparticles for applications including conductive ink applications. The method includes chemical reduction of a metal compound (such as silver acetate), in a reaction mixture that is substantially free of solvent, in embodiments, with a reducing agent (such as phenylhydrazine) in the presence of a stabilizer, such as an organoamine stabilizer. The metal nanoparticles formed during the present solvent-free reducing process are much more stable than metal nanoparticles prepared by previous methods including solvent based processes. The method herein eliminates the need for previously required environmentally harmful solvents such as toluene during metal nanoparticle formation. The chemical reaction process herein further provides reduced production cost by substantially eliminating use of solvents. The method is particularly convenient for preparing low temperature processable metal nanoparticles having an annealing temperature of, for example, about 130° C. or less for the application where low annealing temperature required for conductive features having thickness up to several micrometers to over 10 micrometers.

Metal Nanoparticles

The metal nanoparticles are prepared from the chemical reduction of a metal compound. Any suitable metal compound can be used for the process described herein. Examples of the metal compound include metal oxide, metal nitrate, metal nitrite, metal carboxylate, metal acetate, metal carbonate, metal perchlorate, metal sulfate, metal chloride, metal bromide, metal iodide, metal trifluoroacetate, metal phosphate, metal trifluoroacetate, metal benzoate, metal lactate, metal hydrocarbysulfonate or combinations thereof.

The term "nano" as used in "metal nanoparticles" refers to, for example, a particle size of less than about 1,000 nm, such as, for example, from about 0.5 nm to about 1,000 nm, for example, from about 1 nm to about 500 nm, from about 1 nm to about 100 nm, from about 1 nm to about 25 nm or from about 1 to about 10 nm. The particle size refers to the average diameter of the metal particles, as determined by TEM (transmission electron microscopy) or other suitable method. Generally, a plurality of particle sizes may exist in the metal nanoparticles obtained from the process described herein. In embodiments, the existence of different sized silver-containing nanoparticles is acceptable.

In embodiments, the metal nanoparticles are composed of (i) one or more metals or (ii) one or more metal composites. Suitable metals may include, for example, Al, Ag, Au, Pt, Pd, Cu, Co, Cr, In, and Ni, particularly the transition metals, for example, Ag, Au, Pt, Pd, Cu, Cr, Ni, and mixtures thereof. Silver may be used as a suitable metal. Suitable metal composites may include Au—Ag, Ag—Cu, Ag—Ni, Au—Cu, Au—Ni, Au—Ag—Cu, and Au—Ag—Pd. The metal composites may also include non-metals, such as, for example, Si, C, and Ge. The various components of the metal composite may be present in an amount ranging for example from about 0.01% to about 99.9% by weight, particularly from about 10% to about 90% by weight.

In embodiments, the metal composite is a metal alloy composed of silver and one, two or more other metals, with silver comprising, for example, at least about 20% of the nanoparticles by weight, particularly greater than about 50% of the nanoparticles by weight.

Unless otherwise noted, the weight percentages recited herein for the components of the metal nanoparticles do not include the stabilizer.

The metal nanoparticles may be a mixture of two or more bimetallic metal nanoparticle species, such as those described in commonly assigned U.S. patent application Ser. No. 12/113,628 to Naveen Chopra et al. filed May 1, 2008, which is incorporated herein by reference in its entirety, or a bimodal metal nanoparticle, such as those described in U.S. patent application Ser. No. 12/133,548 to Michelle N. Chretien filed Jun. 5, 2008 now U.S. Pat. No. 7749300, which is also incorporated herein by reference in its entirety.

Reducing Agent

In embodiments, the reducing agent compound may include a hydrazine compound. As used herein, the term "hydrazine compound" includes hydrazine ($N_2H_4$) and substituted hydrazines. The substituted hydrazines may include as substituting groups, for example, any suitable heteroatom such as S and O, and a hydrocarbon group having from, for example, about 0 to about 30 carbon atoms, from about 1 carbon atom to about 25 carbon atoms, from about 2 to about 20 carbon atoms or from about 2 to about 16 carbon atoms. The hydrazine compound may also include any suitable salts and hydrates of hydrazine such as, for example, hydrazine acid tartrate, hydrazine monohydrobromide, hydrazine monohydrochloride, hydrazine dichloride, hydrazine monooxalate, and hydrazine sulfate, and salts and hydrates of substituted hydrazines.

Examples of hydrazine compounds may include hydrocarbyl hydrazine, for example, $RNHNH_2$, $RNHNHR'$ and $RR'NNH_2$, where one nitrogen atom is mono- or di-substituted with R or R', and the other nitrogen atom is optionally mono- or di-substituted with R, where each R or R' is a hydrocarbon group. Examples of hydrocarbyl hydrazine include, for example, methylhydrazine, tert-butylhydrazine, 2-hydroxyethylhydrazine, benzylhydrazine, phenylhydrazine, tolylhydrazine, bromophenylhydrazine, chlorophenylhydrazine, nitrophenylhydrazine, 1,1-dimethylhydrazine, 1,1-diphenylhydrazine, 1,2-diethylhydrazine, and 1,2-diphenylhydrazine.

Unless otherwise indicated, in identifying the substituents for R and R' of the various hydrazine compounds, the phrase "hydrocarbon group" encompasses both unsubstituted hydrocarbon groups and substituted hydrocarbon groups. Unsubstituted hydrocarbon groups may include any suitable substituent such as, for example, a hydrogen atom, a straight chain or branched alkyl group, a cycloalkyl group, an aryl group, an alkylaryl group, arylalkyl group or combinations thereof. Alkyl and cycloalkyl substituents may contain from about 1 to about 30 carbon atoms, from about 5 to 25 carbon atoms and from about 10 to 20 carbon atoms. Examples of alkyl and cycloalkyl substituents include, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, and combinations thereof. Aryl group substituents may contain from about 6 to about 48 carbon atoms, from about 6 to about 36 carbon atoms, from about 6 to about 24 carbon atoms. Examples of aryl substituents include, for example, phenyl, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, or combinations thereof. Substituted hydrocarbon groups may be the unsubstituted hydrocarbon groups described herein which are substituted with one, two or more times with, for example, a halogen (chlorine, fluorine, bromine and iodine), a nitro group, a cyano group, an alkoxy group (methoxyl, ethoxyl and propoxy), or heteroaryls. Examples of heteroaryl groups may include thienyl, furanyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthyridinyl, carbazoyl, or combinations thereof.

Examples of hydrazine compounds may also include hydrocarbyl hydrazine salts (which is a salt of the hydrocarbyl hydrazine described herein) such as, for example, methylhydrazine hydrochloride, phenylhydrazine hydrochloride, benzylhydrazine oxalate, butylhydrazine hydrochloride, butylhydrazine oxalate salt, and propylhydrazine oxalate salt.

Examples of hydrazine compounds also include hydrazides, for example, $RC(O)NHNH_2$, $RC(O)NHNHR'$ and $RC(O)NHNHC(O)R$, where one or both nitrogen atoms are substituted by an acyl group of formula $RC(O)$, where each R is independently selected from hydrogen and a hydrocarbon group, and one or both nitrogen atoms are optionally mono- or di-substituted with R', where each R' is an independently selected hydrocarbon group. Examples of hydrazides may include, for example, formic hydrazide, acethydrazide, benzhydrazide, adipic acid dihydrazide, carbohydrazide, butanohydrazide, hexanoic hydrazide, octanoic hydrazide, oxamic acid hydrazide, maleic hydrazide, N-methylhydrazinecarboxamide, and semicarbazide.

Examples of hydrazine compounds may also include carbazates and hydrazinocarboxylates, for example, $ROC(O)NHNHR'$, $ROC(O)NHNH_2$ and $ROC(O)NHNHC(O)OR$, where one or both nitrogen atoms are substituted by an ester group of formula $ROC(O)$, where each R is independently selected from hydrogen and a hydrocarbon group, and one or both nitrogen atoms are optionally mono- or di-substituted with R', where each R' is an independently selected hydrocarbon group. Examples of carbazates may include, for example, methyl carbazate (methyl hydrazinocarboxylate), ethyl carbazate, butyl carbazate, benzyl carbazate, and 2-hydroxyethyl carbazate.

Examples of hydrazine compounds may also include sulfonohydrazide, for example, $RSO_2NHNH_2$, $RSO_2NHNHR'$, and $RSO_2NHNHSO_2R$ where one or both nitrogen atoms are substituted by a sulfonyl group of formula $RSO_2$, where each R is independently selected from hydrogen and a hydrocarbon group, and one or both nitrogen atoms are optionally mono- or di-substituted with R', where each R' is an independently selected hydrocarbon group. Examples of sulfonohydrazides may include, for example, methanesulfonohydrazide, benzenesulfonohydrazine, 2,4,6-trimethylbenzenesulfonohydrazide, and p-toluenesulfonohydrazide.

Other hydrazine compounds may include, for example, aminoguanidine, thiosemicarbazide, methyl hydrazinecarbimidothiolate, and thiocarbohydrazide.

One, two, three or more reducing agents may be used. In embodiments where two or more reducing agents are used, each reducing agent may be present at any suitable weight ratio or molar ratio such as, for example, from about 99(first reducing agent):1(second reducing agent) to about 1(first reducing agent):99(second reducing agent).

The amount of reducing agent used includes, for example, from about 0.1 to about 10 molar equivalent per mole of metal compound, from about 0.25 to about 4 molar equivalent per mole of metal, or from about 0.5 to about 2 molar equivalent per mole of metal.

Stabilizer

Any suitable stabilizer can be selected herein, wherein the stabilizer has the function of minimizing or preventing the metal nanoparticles from aggregation in a liquid and/or optionally providing or enhancing the solubility or dispersiblity of metal nanoparticles in a liquid. In addition, the stabilizer is "thermally removable" which, as used herein, means that the stabilizer dissociates from the metal nanoparticles surface under certain conditions such as through heating.

In embodiments, the present method provides low temperature processable metal nanoparticles having an annealing temperature of from about 80° C. to about 140° C., and in another specific embodiment having an annealing temperature of about 130° C., and in another specific embodiment having an annealing temperature of about 120° C., and in another specific embodiment having an annealing temperature of about 110° C. While not wishing to be bound by theory, in embodiments, the present process is believed to result in lower temperature annealing capability. The stabilizer, having a shorter carbon chain length than previous stabilizers, such as from about 6 to about 14 carbon atoms, contributes to the lower temperature annealing. For example, in specific embodiments, a stabilizer having a carbon chain length of about 12 carbon atoms carbon atoms is selected. In a specific embodiment, the stabilizer comprises a hydrocarbylamine containing from about 6 to about 14 carbon atoms.

In embodiments, the stabilizer may be an organic stabilizer. The term "organic" in "organic stabilizer" refers to the presence of carbon atoms(s), but the organic stabilizer may include one or more non-metal heteroatoms such as nitrogen, oxygen, sulfur, silicon, halogen, and the like. Exemplary organic stabilizers include thiol and its derivatives, amine and its derivatives, carboxylic acid and its carboxylate derivatives, polyethylene glycols, and other organic surfactants. In embodiments, the organic stabilizer is selected from the group consisting of a thiol such as butanethiol, pentanethiol, hexanethiol, heptanethiol, octanethiol, decanethiol, and dodecanethiol; an amine such as ethylamine, propylamine, butylamine, pentylamine, hexylamine, heptylamine, octylamine, nonylamine, decylamine, and dodecylamine; a dithiol such as 1,2-ethanedithiol, 1,3-propanedithiol, and 1,4-butanedithiol; a diamine such as ethylenediamine, 1,3-diaminopropane, 1,4-diaminobutane; a mixture of thiol and a dithiol; and a mixture of an amine and a diamine. Organic stabilizers containing a pyridine derivative, for example dodecyl pyridine, and/or organophosphine that can stabilize silver-containing nanoparticles can also be selected.

In embodiments, the stabilizer is an organoamine such as butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and mixtures thereof. In a specific embodiment, the stabilizer is dodecylamine. In another specific embodiment, the stabilizer is a hydrocarbylamine having at least 4 carbon atoms. In another specific embodiment, the reducing agent is a phenylhydrazine and the stabilizer comprises dodecylamine.

Examples of other organic stabilizers include, for example, thiol and its derivatives, —OC(=S)SH (xanthic acid), polyethylene glycols, polyvinylpyridine, polyninylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine that can stabilize metal nanoparticles may also be used as a potential stabilizer.

Further examples of organic stabilizers may include: the carboxylic acid-organoamine complex stabilized metal nanoparticles, described in U.S. Patent Application Pub. No. 2009/0148600 A1; the carboxylic acid stabilizer metal nanoparticles described in U.S. Patent App. Pub. No. 2007/0099357 A1, and the thermally removable stabilizer and the UV decomposable stabilizers described in U.S. Patent Application Pub. No. 2009/0181183 A1, each of which is incorporated by reference herein in its entirety.

One, two, three or more stabilizers may be used. In embodiments where two or more stabilizers are used, each stabilizer may be present at any suitable weight or molar ratios, such as a first stabilizer:second stabilizer ratio of about 99:1 to about 1:99. The total amount of the stabilizer can be any suitable amount such as 1, 2, 10, 25 or more molar equivalents of stabilizer per mole of metal compound.

Prior to reduction, in embodiments, the metal compound and the stabilizer may be combined together and heated to a temperature of from about 35° C. to about 70° C., from about 40 to about 60° C. and from about 50 to about 60° C. to dissolve the metal compound and the stabilizer. However, the stabilizer does not form a bond to the metal nanoparticles until addition of the reducing agent.

In embodiments, the metal nanoparticles may form a chemical bond with the stabilizer. The chemical names of the stabilizer provided herein are before formation of any chemical bond with the silver-containing nanoparticles. It is noted that the nature of the stabilizer may change with the formation of a chemical bond, but for convenience the chemical name prior to formation of the chemical bond is used. The attractive force between the metal nano-particles and the stabilizer can be a chemical bond, a physical attachment, or a combination thereof. The chemical bond can take the form of covalent bonding, hydrogen bonding, coordination complex bonding, ionic bonding, or a mixture of different chemical bonding. The physical attachment can take the form of van der Waals' forces or dipole-dipole interaction, or a mixture of different physical attachments.

The extent of the coverage of stabilizer on the surface of the metal nanoparticles can vary such as from partial to full coverage depending, for example, on the capability of the stabilizer to stabilize the metal nanoparticles. There is also variability in the extent of coverage of the stabilizer among the individual metal nanoparticles.

The weight percentage of the stabilizer attached to the metal nanoparticle may be from, for example, about 5 weight percent to about 80 weight percent, from about 10 weight percent to about 60 weight percent or from about 15 weight percent to about 50 weight percent by weight, based upon the total weight of the nanoparticle composition.

The mole ratio of stabilizer to metal compound can be any suitable mole ratio. In embodiments, the mole ratio of stabilizer to metal compound (stabilizer:silver salt) is no less than about 3 to 1, no less than about 4 to 1, or no less than about 5 to 1. In further embodiments, the metal nanoparticles having the stabilizer on the surface of the metal nanoparticles may be isolated from the reaction mixture.

Reduction & Formation of Metal Nanoparticles

In embodiments, the metal compound is reacted or reduced by the reducing agent in the presence of a stabilizer in a reaction mixture. The reaction mixture is comprised of the metal compound, the stabilizer and the reducing agent.

In embodiments, the reaction mixture is substantially free of any solvent, which enables the preparation of shorter chain organoamine stabilized silver nanoparticles having increased stabilization compared with the previous process using a solvent such as toluene. For example, dodecylamine stabilized silver-nanoparticles prepared with a solvent such as toluene would be degraded in a few days. However, dodecylamine stabilized silver nanoparticles prepared with the present method can remain stable for about several months or years. Thus, the present method enables preparation of low annealing temperature nanoparticles.

In specific embodiments, the total amount of any solvent is less than about 40 weight percent, or less than about 20 weight percent, or less than about 5 weight percent, based on the total weight of the reaction mixture, and in a specific embodiment wherein the reaction mixture is free of any solvent (that is, contains zero weight percent solvent).

The reaction of the metal compound (in the presence of a stabilizer) with the reducing agent to form the stabilized metal nanoparticles is carried out at any suitable temperature such as from about −50° C. to about 80° C., or from about −25° C. to about 80° C., or from about 0° C. to about 70° C., from about 20° C. to about 70° C., or from about 35° C. to about 65° C. The stabilized metal nanoparticles may then be precipitated in any suitable organic and aqueous solvents such as methanol, ethanol, isopropanol, acetone, water and the mixtures thereof and then collected by any suitable technique for collecting stabilized metal nanoparticles, such as filtration, centrifugation and/or decantation.

Composition

The present disclosure further describes a liquid composition comprising, a polymeric binder, a liquid and a plurality of metal nanoparticles with a stabilizer, wherein the molecules of the stabilizer are on the surface of the metal nanoparticles, wherein the metal nanoparticles are a product of a reaction of a metal compound with a reducing agent comprising a hydrazine compound in the presence of a thermally removable stabilizer in a reaction mixture that is substantially free of solvent comprising the metal compound, the reducing agent, and the stabilizer.

The composition comprises a polymeric binder, which increases the adhesion of the metal nanoparticles upon deposition to a substrate and further allows for a highly conductive film with a thickness of up to about 15 micrometers to be deposited on a substrate. The inclusion of a polymeric binder in the composition also improves the mechanical properties for the deposited conductive feature, such as resistance to scratch, increased flexibility and resistance to cracking. Any polymeric binder may be included in the composition, such that the glass transition temperature of the polymeric binder is lower than the heating temperature for the deposited composition.

Examples of polymeric binders include organic polymeric film forming binders such as thermoplastic and thermosetting resins such as polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrenebutadiene copolymers, vinylidenechloride-vinylchloride copolymers, vinylacetate-vinylidenechloride copolymers, styrene-alkyd resins, polyvinylcarbazole, and the like. These polymers may be block, random or alternating copolymers.

The liquid that can be used to disperse or dissolve the stabilized metal nanoparticles and the polymeric binder to form a liquid composition include organic liquids or water. Exemplary organic liquids include hydrocarbon solvents pentane, hexane, cyclohexane, heptanes, octane, nonane, decane, undecane, dodecane, tridecane, tetradecane, toluene, xylene, mesitylene, trimethylbenzene and the like; alcohols such as methanol, ethanol, propanol, butanol, terpineol and the like; tetrahydrofuran, chlorobenzene, dichlorobenzene, trichlorobenzene, nitrobenzene, cyanobenzene, N,N-dimethylformamide (DMF), acetonitrile; and combinations thereof. Other examples of organic liquids include paraffin solvents such as n-paraffin liquids, isoparaffin liquids, and cycloparaffin liquids, such those manufactured under the tradename ISOPAR by Exxon Mobil. One, two, three or more liquids may be used. In embodiments, where two or more liquids are used, each liquid may be present at any suitable volume or molar ratio such as a ratio of first liquid to second liquid of from about 99:1 to about 1:99.

The components of the liquid composition can be present in any suitable amount. Exemplary amounts include wherein the metal nanoparticles and the stabilizer are present in an amount of form about 0.3% to about 90%, or from about 1% to about 70%, by weight, based upon the total weight of the nanoparticle composition. The polymeric binder may be present in the liquid composition in amount from about 1% to about 25%, from about 2% to about 20%, from about 2% to about 10% and from about 5% to about 10%, by weight, based upon the total weight of the liquid composition. The remaining balance of the liquid composition being the other components of the liquid composition such as the liquid.

In embodiments, the stabilizer present in the liquid composition originated from the reaction mixture for the preparation of metal nanoparticles; no stabilizer is added subsequently for the formation of the metal nanoparticles. In other embodiments, the same or a different stabilizer may be added subsequently from the formation of the metal nanoparticles in any suitable amount such as from about 0.3% to about 70% by weight based upon the total weight of the liquid composition.

Stability

Stability herein refers to a time period during which there is minimal or no precipitation or aggregation of the liquid composition of metal nanoparticles. The liquid composition of metal nanoparticles herein has a stability of at least about 3 hours, or form about 3 hours to about 1 month, or from about 1 day to about 3 months, or from about 1 day to about 6 months, or from about 1 week to over one year, at a temperature from about 0° C. to about 60° C. In embodiments herein, the liquid composition of metal nanoparticles described herein has a stability of from about 3 hours to about 1 day, or from about 1 day to about one week, or from about 1 day to about 1 month, or from about 1 day to about 6 months, or from about 1 day to about 1 year, or from about 1 day to over 1 year. In one embodiment, the liquid composition of metal nanoparticles herein has a stability of more than two months at a temperature of about 25° C. In another embodiment, the liquid composition of metal nanoparticles herein has a stability of more than three months at a temperature of from about 25° C. In another embodiment, the liquid composition of metal-nanoparticles has a stability of at least 7 days when the composition is stored at about 60° C. or lower.

If the metal nanoparticle is silver, the liquid composition of silver nanoparticles has a stability (that is, the time period where there is minimal precipitation or aggregation of the silver-containing nanoparticles) of, for example, at least about 1 day, or from about 3 days to about 1 week, from about 5 days to about 1 month, from about 1 week to about 6 months, or from about 1 week to over 1 year.

Liquid Deposition Technique

The fabrication of conductive features on electrically conductive metal element from the liquid composition can be carried out by depositing the composition on a substrate using any suitable liquid deposition technique at any suitable time prior to or subsequent to the formation of other optional layer or layers on the substrate. Thus, liquid deposition of the composition on the substrate can occur either on a substrate or on a substrate already containing layered material, for example, a semiconductor layer and/or an insulating layer of a thin-film transistor.

The phrase "liquid deposition technique" refers to, for example, deposition of a composition using a liquid process such as liquid coating or printing technique, where the liquid is a homogeneous or heterogeneous dispersion of the metal nanoparticles and the polymeric binder. The metal nanoparticle, if present in liquid form, may be referred to as an ink when deposited on a substrate. Furthermore, the liquid composition may be deposited in any suitable pattern on the substrate.

Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. In embodiments, liquid deposition of the liquid composition deposits a layer of the composition having a thickness ranging from about 5 nanometers to about 1000 micrometers, from about 10 nanometers to about 500 micrometers, from about 50 nanometers to about 100 micrometers, from about 1 micrometer to about 50 micrometers and from about 5 micrometers to about 30 micrometers. The deposited liquid composition at this stage may or may not exhibit appreciable electrical conductivity.

The metal nanoparticles can be spin-coated from the metal nanoparticles composition, for example, for about 10 seconds to about 1000 seconds, for about 50 seconds to about 500 seconds or from about 100 seconds to about 150 seconds, onto a substrate at a speed, for example, from about 100 revolutions per minute ("rpm") to about 5000 rpm, from about 500 rpm to about 3000 rpm and from about 500 rpm to about 2000 rpm.

The substrate upon which the conductive features are deposited may be any suitable substrate, including, for example, silicon, glass plate, plastic film, sheet, fabric, or paper. For structurally flexible devices, plastic substrates, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

Heating the deposited composition at a temperature of, for example, at or below about 140° C., such as, for example, from about 80° C. to about 140° C., from about 80° C. to about 130° C., from about 80° C. to about 120° C. and from about 80° C. to about 110° C. to induce or "anneal" the metal nanoparticles to form conductive features which are suitable for use as an electrically conductive elements. The heating temperature is one that does not cause adverse changes in the properties of previously deposited layer(s) or the substrate (whether single layer substrate or multilayer substrate). Also, the low heating temperatures described above allows the use of low cost plastic substrates, which have an annealing temperature below 130° C.

The heating can be performed for a time ranging from, for example, 1 minute to about 10 hours, from about 5 minutes to about 5 hours and from about 10 minutes to about 3 hours. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, the term "heating" encompasses any technique(s) that can impart sufficient energy to the heated material or substrate to (1) anneal the metal nanoparticles and/or (2) remove the optional stabilizer from the metal nanoparticles. Examples of heating techniques may include thermal heating (for example, a hot plate, an oven, and a burner), infra-red ("IR") radiation, a laser beam, microwave radiation, or UV radiation, or a combination thereof.

Heating produces a number of effects. Prior to heating, the layer of the deposited metal nanoparticles may be electrically insulating or with very low electrical conductivity, but heating results in an electrically conductive layer composed of annealed metal nanoparticles, which increases the conductivity. In embodiments, the annealed metal nanoparticles may be coalesced or partially coalesced metal nanoparticles. In embodiments, it may be possible that in the annealed metal nanoparticles, the metal nanoparticles achieve sufficient particle-to-particle contact to form the electrically conductive layer without coalescence.

In embodiments, after heating, the resulting electrically conductive layer has a thickness ranging, for example, from about 5 nanometers to about 5 micrometers, from about 10 nanometers to about 500 micrometers, from about 100 nanometers to about 200 micrometers, from about 1 micrometer to about 100 micrometers, from about 5 micrometers to about 25 micrometers and from about 10 micrometers to about 20 micrometers.

The conductivity of the resulting metal element produced by heating the deposited liquid composition is, for example, more than about 100 Siemens/centimeter ("S/cm"), more than about 1000 S/cm, more than about 2,000 S/cm, more than about 5,000 S/cm, or more than about 10,000 S/cm.

The resulting conductive elements can be used as conductive electrodes, conductive pads, conductive traces, conductive elements, conductive tracks, and the like, in electronic devices. The phrase "electronic device" refers to macro- micro- and nano-electronic devices such as thin film transistor, organic light emitting diodes, radiofrequency identification tags, photovoltaics, and other electronic devices which require conductive elements or components.

In embodiments, the liquid composition can be used to fabricate conductive components such as source and drain electrodes in thin film transistors (TFT). See U.S. Pat. Nos. 7,270,694 and 7,494,608, each of which are hereby totally incorporated by reference herein, for a description of possible TFT configurations.

EXAMPLES

The following Examples further illustrate various embodiments of the present disclosure. Also, parts and percentages are by weight unless otherwise indicated.

Example 1

20 grams of silver acetate and 112 grams of dodecylamine were added to a 1 Liter reaction flask. The mixture was heated and stirred for about 10 to 20 minutes at 65° C. until the dodecylamine and silver acetate were dissolved. 7.12 grams of phenylhydrazine was added to the above liquid drop-wise with vigorous stirring at 55° C., The color of liquid changed from clear to dark brown indicating the formation of silver nanoparticles. The mixture was further stirred for one hour at 55° C. and then was cooled down to 40° C. After the temperature reached 40° C., 480 milliliters of methanol was added and the resulting mixture was stirred for about 10 minutes. The precipitate was filtered and rinsed briefly with methanol. The precipitate was dried under vacuum overnight at room temperature, yielding 14.3 grams of silver nanoparticles with 86.6 weight percent of silver content.

Example 2

0.04 grams of polystyrene was dissolved in 1.4 grams of toluene. After the polystyrene was completely dissolved, 2 grams of the silver nanoparticles of Example 1 (58 wt. %) were added to the solution with good mixing. The prepared composition was spin coated on two glass slides at a varying rate of spin. The coated films on the two glass slides were heated in an oven at 130° C. for 30 minutes to yield a shiny mirror-like film having a thickness of 1.4 micrometers and 3.2 micrometers, respectively. The conductivity of the annealed films was $3.74 \times 10^4$ S/cm (thickness 1.4 micrometers) and $2.31 \times 10^4$ S/cm (thickness 3.2 micrometers), which was measured using the conventional four-probe technique. The coating solution of the silver nanoparticles was stable for more than 7 days without precipitation at room temperature.

Example 3

0.08 grams of polystyrene was dissolved in 1.4 grams of toluene. After the polystyrene was completely dissolved, 2 grams of the silver nanoparticles of Example 1 (57 wt. %) was added to the solution. The prepared composition was spin coated on two glass slides at a varying rate of spin. The coated films on the two glass slides were heated in an oven at 130° C. for 30 minutes to yield a shiny mirror-like films having a thickness of 7.2 micrometers and 15.3 micrometers, respectively. The conductivity of the annealed films was $3.74 \times 10^3$ S/cm (thickness 7.2 micrometers) and $1.14 \times 10^3$ S/cm (thickness 15.3 micrometers), which was measured using the conventional four-probe technique. The coating solution of the silver nanoparticles was stable for more than 7 days without precipitation at room temperature.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:
1. A method of forming conductive features on a substrate, the method comprising:
reacting a metal compound with a reducing agent in the presence of a stabilizer in a reaction mixture comprising the metal compound, the reducing agent, and the stabilizer, wherein the reaction mixture is substantially free of solvent, to form a plurality of metal nanoparticles with molecules of the stabilizer on the surface of the metal nanoparticles;

isolating the plurality of metal nanoparticles with the molecules of the stabilizer on the surface of the metal nanoparticles;
preparing a liquid composition including a polymeric binder, a liquid and the plurality of metal nanoparticles with molecules of the stabilizer on the surface of the metal nanoparticles;
depositing the liquid composition on a substrate by a liquid deposition technique to form a deposited composition; and
heating the deposited composition to form conductive features on the substrate.

2. The method of claim 1, wherein the metal compound is selected from the group consisting of metal oxide, metal nitrate, metal nitrite, metal carboxylate, metal acetate, metal carbonate, metal perchlorate, metal sulfate, metal chloride, metal bromide, metal iodide, metal trifluoroacetate, metal phosphate, metal trifluoroacetate, metal benzoate, metal lactate, metal hydrocarbysulfonate and mixtures thereof.

3. The method of claim 1, wherein the metal nanoparticles are selected from the group consisting of silver, gold, platinum, palladium, copper, cobalt, chromium, nickel, silver-copper composite, silver-gold-copper composite, silver-gold-palladium composite and combinations thereof.

4. The method of claim 1, wherein the metal nanoparticles are selected from a group consisting of silver, silver-copper composite, silver-gold-copper composite, silver-gold-palladium composite and combinations thereof.

5. The method of claim 1, wherein the stabilizer is selected from the group consisting of butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine and trihexylamine.

6. The method of claim 1, wherein the reducing agent is a hydrazine compound.

7. The method of claim 6, wherein the hydrazine compound is one or more of (1) a hydrocarbyl hydrazine represented by the following formulas: $RNHNH_2$, $RNHNHR'$ or $RR'NNH_2$, wherein one nitrogen atom is mono- or di-substituted with R, and the other nitrogen atom is optionally mono- or di-substituted with R, wherein R is independently selected from a hydrogen or hydrocarbon group or mixtures thereof, wherein one or both nitrogen atoms are optionally mono- or di-substituted with R' and wherein R' independently selected from a group consisting of hydrogen or hydrocarbon group or mixtures thereof, (2) a hydrazide represented by the following formulas: $ROC(O)NHNHR'$, $ROC(O)NHNH_2$ or $ROC(O)NHNHC(O)OR$), wherein one or both nitrogen atoms are substituted by an acyl group of formula $RC(O)$, wherein each R is independently selected from a hydrogen or hydrocarbon group or mixtures thereof, wherein one or both nitrogen atoms are optionally mono- or di-substituted with R' and wherein R' independently selected from a group consisting of hydrogen or hydrocarbon group or mixtures thereof, and (3) a carbazate represented by the following formulas: $ROC(O)NHNHR'$, $ROC(O)NHNH_2$ or $ROC(O)NHNHC(O)OR$, wherein one or both nitrogen atoms are substituted by an ester group of formula $ROC(O)$, wherein R is independently selected from a group consisting of hydrogen and a linear, branched, or aryl hydrocarbon, wherein one or both nitrogen atoms are optionally mono- or di-substituted with R' and wherein R' is independently selected from a group consisting of hydrogen or hydrocarbon group or mixtures thereof.

8. The method of claim 1, wherein the polymeric binder is selected from the group consisting of polyethersulfones, polyethylenes, polypropylones, polyimides, polymethylpentenes, polyphenylene sulfides, polyvinylacetate, polysiloxanes, polyacrylates, polyvinylacetals, polyamides, amino resins, phenylene oxide resins, terephthalic acid resins, phenoxy resins, epoxy resins, phenylic resins, polystyrene and acrylonitrile copolymers, polyvinyl chloride, vinyl chloride and vinyl acetate copolymers, acrylate copolymers, alkyd resins, cellulosic film, formers, poly(amideimide), styrene butadiene copolymers, vinylidene chloride-vinyl chloride copolymers, vinyl acetate-vinylidene chloride copolymers, styrene-alkyd resins, polyvinylcarbazole, and mixtures thereof.

9. The method of claim 1, wherein the liquid is selected from the group consisting of water, n-paraffin liquids, isoparaffin liquids, cycloparaffin liquids, pentane, hexane, cyclohexane, heptane, octane, nonane, decane, undecane, dodecane, tridecane, tetradecane, toluene, xylene, mesitylene, trimethylbenzene, methanol, ethanol, propanol, butanol, pentanol, hexanol, heptanol, octanol, terpineol, tetrahydrofuran, chlorobenzene, dichlorobenzene, trichlorobenzene, nitrobenzene, cyanobenzene, acetonitrile, dichloromethane, N,N-dimethylformamide (DMF), and combinations thereof.

10. The method of claim 1, wherein liquid deposition is selected from the group consisting of spin coating, blade coating, rod coating, dip coating, lithography or offset printing, gravure, flexography, screen printing, stencil printing, inkjet printing, and stamping.

11. The method of claim 1, wherein the heating is accomplished at a temperature below of about 80° C. to about 140° C.

12. The method of claim 1, wherein the metal nanoparticles comprise silver nanoparticles having an annealing temperature of about 80° C. to about 140° C., the conductive features have a thickness of more than 1 micron, and wherein the silver nanoparticles form a metal framework with a conductivity of at least about 5,000S/cm.

13. The method of claim 1, wherein the reaction of the metal compound with the reducing agent is carried out at a temperature of from about −25° C. to about 80° C.

14. The method of claim 1, wherein the reducing agent is a phenylhydrazine and the stabilizer comprises dodecylamine.

15. A method of forming conductive features on a substrate, the method comprising:
reacting a metal compound with a reducing agent in the presence of a stabilizer in a reaction mixture comprising the metal compound, the reducing agent, and the stabilizer, wherein the reaction mixture is substantially free of solvent, to form a plurality of metal nanoparticles during the solvent-free reduction process with molecules of the stabilizer on the surface of the metal nanoparticles;
isolating the plurality of metal nanoparticles with the molecules of the stabilizer on the surface of the metal nanoparticles;
preparing a liquid composition including a polymeric binder, a liquid and the plurality of metal nanoparticles with molecules of the stabilizer on the surface of the metal nanoparticles;
depositing the liquid composition on a substrate by a liquid deposition technique to form a deposited composition; and heating the deposited composition to form conductive features on the substrate with a thickness of from about 1 micrometer to about 100 micrometers.

16. The method of claim 15, wherein the heating is accomplished at a temperature of about 80° C. to about 140° C.

17. The method of claim 15, wherein the polymeric binder has a glass transition temperature that is lower than the heating temperature for the deposited composition.

18. A method of forming conductive features on a substrate, the method comprising:

reacting a metal acetate compound with a reducing agent in the presence of an organoamine stabilizer in a reaction mixture comprising the metal acetate compound, the reducing agent, and the organoamine stabilizer, wherein the reaction mixture is free of solvent., to form a plurality of metal nanoparticles with molecules of the organoamine stabilizer on the surface of the metal nanoparticles;

isolating the plurality of metal nanoparticles with the molecules of the organoamine stabilizer on the surface of the metal nanoparticles;

preparing a liquid composition including a polymeric binder, a liquid and the plurality of metal nanoparticles with molecules of the organoamine stabilizer on the surface of the metal nanoparticles;

depositing the liquid composition on a substrate by a liquid deposition technique to form a deposited composition; and heating the deposited composition to form conductive features on the substrate.

19. A method of forming conductive silver features on a substrate, the method comprising:

reacting silver acetate with phenylhydrazine in the presence of an organoamine stabilizer in a reaction mixture comprising the silver acetate, the phenylhydrazine, and the organoamine stabilizer, wherein the reaction mixture is free of solvent, to form a plurality of silver nanoparticles with molecules of the organoamine stabilizer on the surface of the silver nanoparticles;

isolating the plurality of silver nanoparticles with the molecules of the organoamine stabilizer on the surface of the silver nanoparticles;

preparing a liquid composition including a polymeric binder, toluene and the plurality of silver nanoparticles with molecules of the organoamine stabilizer on the surface of the silver nanoparticles;

spin-coating the liquid composition on a substrate by a liquid deposition technique to form a deposited composition; and heating the deposited composition to form conductive silver features on the substrate.

* * * * *